(12) United States Patent
Cook et al.

(10) Patent No.: US 8,369,006 B1
(45) Date of Patent: Feb. 5, 2013

(54) NANOPARTICLE DOPED HYBRID PHOTOREACTIVES

(75) Inventors: Gary Cook, Beavercreek, OH (US); Dean R Evans, Beavercreek, OH (US); Anatoly Gluschenko, Colorado Springs, CO (US); Victor Yu Reshetnyak, Kyiv (UA)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 129 days.

(21) Appl. No.: 13/089,604

(22) Filed: Apr. 19, 2011

Related U.S. Application Data

(62) Division of application No. 12/214,294, filed on Jun. 12, 2008, now Pat. No. 8,018,648.

(60) Provisional application No. 60/943,336, filed on Jun. 12, 2007.

(51) Int. Cl.
 - H01S 3/16 (2006.01)
 - H01S 3/20 (2006.01)
 - G02F 1/05 (2006.01)

(52) U.S. Cl. ........ 359/342; 977/778; 977/779; 977/834; 977/838; 977/951

(58) Field of Classification Search .................. 359/342; 977/773, 778, 779, 834, 838, 951
See application file for complete search history.

(56) References Cited

U.S. PATENT DOCUMENTS

| | | | |
|---|---|---|---|
| 5,075,573 | A | 12/1991 | Huignard et al. |
| 5,130,849 | A | 7/1992 | Valley et al. |
| 5,508,829 | A | 4/1996 | Freeouf et al. |
| 6,597,496 | B1 | 7/2003 | Nayfeh et al. |
| 6,608,716 | B1 | 8/2003 | Armstrong et al. |
| 6,710,366 | B1 | 3/2004 | Lee et al. |
| 7,106,508 | B2 | 9/2006 | Du et al. |
| 7,306,899 | B2 | 12/2007 | Wu |
| 7,346,248 | B2 | 3/2008 | Atwater et al. |
| 2003/0175004 | A1 | 9/2003 | Garito et al. |
| 2003/0202770 | A1 | 10/2003 | Garito et al. |
| 2004/0095658 | A1 | 5/2004 | Buretea et al. |
| 2005/0107478 | A1 | 5/2005 | Klimov et al. |

OTHER PUBLICATIONS

Bartkiewicz et al., "High gain of light in photoconducting polymer-nematic liquid crystal hybrid structures", Optics Communications, vol. 187, pp. 257-261 (2001).

Cook, G., et al., "Liquid crystal inorganic hybrid photorefractives", 2008 IEEE/LEOS Winter Topical Meeting Series, pp. 129-130 (2008).

*Primary Examiner* — Eric Bolda
(74) *Attorney, Agent, or Firm* — AFMCLO/JAZ; Charles Figer

(57) ABSTRACT

The present invention provides a photorefractive hybrid cell including a window and a gain media disposed adjacent the window. The gain media includes nanoparticles therein. The window includes a material that forms a space-charge field. The gain media includes a material having refractive index properties that depend on an electric field. The nanoparticles include a material which responds orientationally to the presence of an electric or magnetic field.

20 Claims, 4 Drawing Sheets

NANOPARTICLE DOPED HYBRID PHOTOREACTIVES

CROSS-REFERENCE TO RELATED APPLICATIONS

This application is a divisional of U.S. application Ser. No. 12/214,294 entitled "Nanoparticle Doped Hybrid Photorefractives," filed on Jun. 12, 2008, which relates to and claims priority to U.S. Provisional Patent Application No. 60/943,336 filed Jun. 12, 2007, the entireties of which are incorporated by reference herein.

The invention described herein may be manufactured and used by or for the Government of the United States for all governmental purposes without the payment of any royalty.

FIELD OF THE INVENTION

The present invention relates to hybrid photorefractive technology, and more particularly, relates to photorefractive hybrid cells doped with nanoparticles.

BACKGROUND OF THE INVENTION

Generally, a hybrid cell includes a photorefractive window and a layer of liquid crystal or polymeric material. In existing hybrid photorefractives, the evanescent space-charge field from one or more photorefractive windows induces a modulation of the refractive index in one or more adjacent layers of liquid crystal or polymeric material. As a result, the omnipresent evanescent photorefractive space-charge field increases the overall device index modulation by inducing an additional index modulation in adjacent high birefringence material(s) which may or may not themselves be inherently photorefractive.

More specifically, on exposure to optical intensity gradients (such as the interference between two mutually coherent laser beams) photogenerated charges diffuse to create a modulated space-charge field within the inorganic windows of the hybrid cell. Penetration of the surface space-charge field into the liquid crystal layer modulates the director alignment of the liquid crystal molecules, creating diffractive beam coupling within the liquid crystal layer. In practice, this inherent simplicity belies a more complex nature. The beam coupling is unidirectional, leading to strong power coupling from one beam to another irrespective of the relative intensities of the beams. The origin of the large unidirectional gain in the liquid crystal layer arises from a combination of local surface induced pre-tilt of the liquid crystal molecules together with splay-induced flexopolarization of the nematic liquid crystal. A pre-tilt of the liquid crystal molecular surface alignment permits spatial frequency matching of the optical interference pattern and the resulting index grating, while splay induced flexopolarization enables the otherwise nematic material to become sensitive to the sign of the space-charge field.

Current hybrid cells have been successful, but the potential benefits of the hybrid photorefractive technology have been limited by the relatively small magnitude of the available evanescent space-charge field. Great improvements to the hybrid device performance are possible if either the space-charge field can be increased significantly, or if the sensitivity of the adjacent liquid crystal or polymer layer(s) to the influence of the electric field can be improved. One example of such hybrid device would include a liquid crystal layer with a 45 degree pretilt, with preferably a low anchoring energy. In devices where charge migration is dominated by diffusion and also in situations where the application of external electric fields is undesirable, increasing the sensitivity of the liquid crystal or polymer layer(s) to the space charge field is the most practical method for improving device performance. As such, there is a need for improved photorefractive hybrid cells.

SUMMARY OF THE INVENTION

The present invention provides hybrid photorefractives that include one or more windows and one or more adjacent layers of gain media. The gain media may be a liquid crystal or a polymer material that includes nanoparticles. These nanoparticles may be any solid or gel (as distinct from liquid droplets) and may be either active or passive (and inorganic or organic) in nature. For example, the nanoparticles may be ferroelectric nanoparticles. Nanoparticles have a pronounced effect on the gain characteristics, sensitivity, birefringence, speed and photorefractive beam coupling of the hybrid cell. Additionally, the present invention permits transient or steady state optical interactions with thermally absorbed radiation, optical fields, acoustic radiation, and induced electrostriction.

In accordance with one aspect of the invention, there is provided a photorefractive hybrid cell including a window and a gain media disposed adjacent the window. The gain media has nanoparticles therein. The window may include a material that forms a space-charge field; for example, the window may include a photorefractive material. The gain media may include a material having refractive index properties that depend on an electric or magnetic field; for example, the gain media may include electro-optic material or birefringent material. The gain media may be a liquid crystal or a polymer material, for example.

The nanoparticles may include a material which responds orientationally to the presence of an electric or a magnetic field. The nanoparticles may include a solid or gel material or may be disposed in a solution. The nanoparticles may be ferroelectric or ferromagnetic. For example, the nanoparticles may include barium titanate ($BaTiO_3$), lead titanate ($PbTiO_3$), lithium niobate $LiNbO_3$), and potassium niobate ($KNbO_3$). The size of the nanoparticles may be in the range of 0.1 nm to 500 nm. The concentration of nanoparticles in the gain media may be approximately in the range of 0.001 wt % to 10.0 wt %. The nanoparticles may also include a coating.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Figure 1:
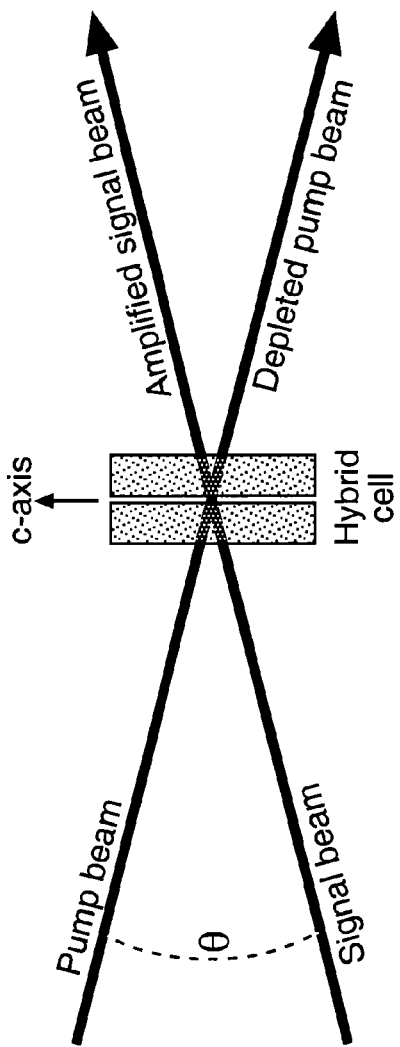
FIG. 1 is an exemplary photorefractive hybrid cell of the present invention.

Referring to FIG. 1, a photorefractive hybrid cell of the present invention is illustrated. The hybrid cell includes one or more windows and one or more media doped with nanoparticles. The windows may be any known photorefractive material and/or any material that forms a space-charge field from charge migration arising from either diffusion and/or drift in the form of bulk or epitaxial thin film materials. Examples of window materials may include, but are not limited to, strontium barium niobate doped cerium (Ce:SBN), photonic crystal, doped or undoped semiconductors, doped or undoped SPS, doped BaTi03, doped KNb03, or any other space-charge field forming material known in the art.

Placed adjacent to the window is the nanoparticle-doped media. The media may be any material having refractive index properties that depend on an electric or magnetic field. Such materials may be either intrinsically electro-optic (e.g. linear or quadratic Pockel's Effect materials, Kerr type materials, etc.) or birefringent by virtue of molecular or atomic rotation (e.g. liquid crystals, polymeric, as well as monomer and oligomer, materials; organic dyes; organic-inorganic complexes such as metal phthalocyanine; metal chelates). Examples of gain media include, but are not limited to, E7 liquid crystal, TL205 liquid crystal, and 5CB. A liquid crystal media may be cholesteric, nematic, smectic, discotic, ferroelectric, ferroic, columnar, lyotropic, oligomer, and/or azoliquid crystal.

The nanoparticles may be any solid or gel and may be active or passive in nature. The nanoparticles may also be solid or gel material in suspension, which is added to the media. Fabrication of the nanoparticles may be, for example, chemically grown, sintered, or ball-milled. The range of sizes of nanoparticles may span the range from 0.1 nm to 500 nm, although typically the particle sizes may be in the range of 1 nm to 100 nm. The shape of the nanoparticles may be, for example, spherical, cylindrical, cubic, spherulitic, elongated, jagged, or plate-like. Various concentrations of nanoparticles in the gain medium may be present. The concentration can vary depending on needed gain and gain reversibility (for example, 0.001 wt % to 10.0 wt %).

The particles may be added directly to a liquid or polymer pre-cursor (monomer), or they may be pre-treated or coated with other substances to promote better solubility, discourage aggregation, or to add functionality to the nanoparticles. Additionally, a surfactant may be used to increase solubility and to prevent aggregation and this may be introduced to the surface of the nanoparticles during the particle fabrication process (prolonged grinding within a surfactant medium).

Functionality may also be added to the nanoparticles by pre-coating with a material which is able to interact chemically with the host medium, or electrically with the space-charge field. The nanoparticles (and/or any coatings on the nanoparticles) may also possess magnetic properties to permit direct interaction with external magnetic fields and/or indirect interaction with the electric space-charge field. In particular, nanoparticles with magnetic properties are useful for enhancing transient effects in the hybrid device. The particles may be pyroelectric, photovoltaic, thermophotovoltaics, or piezoelectric in nature, to enable thermal, optical or acoustic (and electrostrictive) interactions with light. The addition of nanoparticles to the gain media extends the optical wavelength range of the hybrid cell.

The nanoparticles may be ferroelectric which provide a means of increasing the sensitivity of the liquid crystal matrix (or polymeric material) to external electric fields through coupling of the liquid crystal director with the nanoparticles. For example, the ferroelectric nanoparticles may include barium titanate ($BaTiO_3$), lead titanate ($PbTiO_3$), lithium niobate ($LiNbO_3$), potassium niobate ($KNbO_3$), and other known ferroelectric materials known in the art.

The nanoparticles do not necessarily need to be ferroelectric; rather, they simply need to respond orientationally to the presence of an electric (or even a magnetic field) field. The reorientational effect either be sensitive to the sign of the space-charge field (e.g. as with ferroelectric/ferromagnetic/multi-ferroic materials) or the can be only sensitive to the orientation of the field (e.g. similar to nematic liquid crystal behavior). For magnetic-responsive materials, the magnetic field may either be a primary field originating from discrete magnetic elements or from magneto-optic interactions, or may be a secondary consequence arising from the flow of electrical charge in the hybrid cell window.

Various embodiments of the present invention are contemplated. Using the methods and techniques described herein, one skilled in the art can practice the invention by combining various windows, media, and nanoparticles to produce doped photorefractive hybrid cells. The different types of windows, media, and nanoparticles are previously provided.

In one exemplary embodiment, two uncoated inorganic crystals of strontium barium niobate doped with 0.01 weight % cerium (Ce:SBN 60) were used as windows for the liquid crystal cell. The crystal c-axes were aligned parallel to one of the 20 mm long edges and the linear absorption coefficient for each window (light polarized parallel to the c-axis) was approximately 0.5 cm-1. Each crystal was electrically poled to create a single ferroelectric domain. The inside surfaces of the windows were spin coated at 4000 RPM for 30 seconds with a nylon multipolymer, followed by uni-axially rubbing along the Ce:SBN negative c-axis direction with a low-speed nylon roller. The c-axis negative direction is defined as being the direction opposite to that of beam amplification during two beam coupling experiments. The cell windows were aligned with parallel c-axes and held together using simple spring clips, and the cell spacing was defined by 8 μm glass rods dispersed at low concentration in the liquid crystal medium.

Moreover, ferroelectric nanoparticles were prepared by prolonged wet grinding of barium titanate ($BaTiO_3$) powder in a zirconia ball mill. The grinding fluid was heptane, to which oleic acid was added as a surfactant. The addition of a surfactant prevents agglomeration of the $BaTiO_3$ anoparticles and to enable small sizes to be achieved (~10 nm). Stock solutions were prepared using a 1:1:20 ratio of $BaTiO_3$:oleic acid:heptane by weight respectively (equivalent to approximately 4.5 weight % nanoparticle stock solution). Immediately before use, the nanoparticle suspensions were placed in an ultrasound bath for a few seconds to ensure complete dispersion. A quantity of each solution was then added to TL205 liquid crystal and the heptane solvent allowed to evaporate slowly while gently heating to just below the clearing temperature with occasional excitation in an ultrasound bath to ensure uniform dispersion of the $BaTiO_3$ nanoparticles. Periodic weighing of the preparation vessel allowed for the determination of when the heptane had been completely evaporated. Each final solution of TL205 liquid crystal contained 0.5 weight % $BaTiO_3$ nanoparticles.

Figure 2:
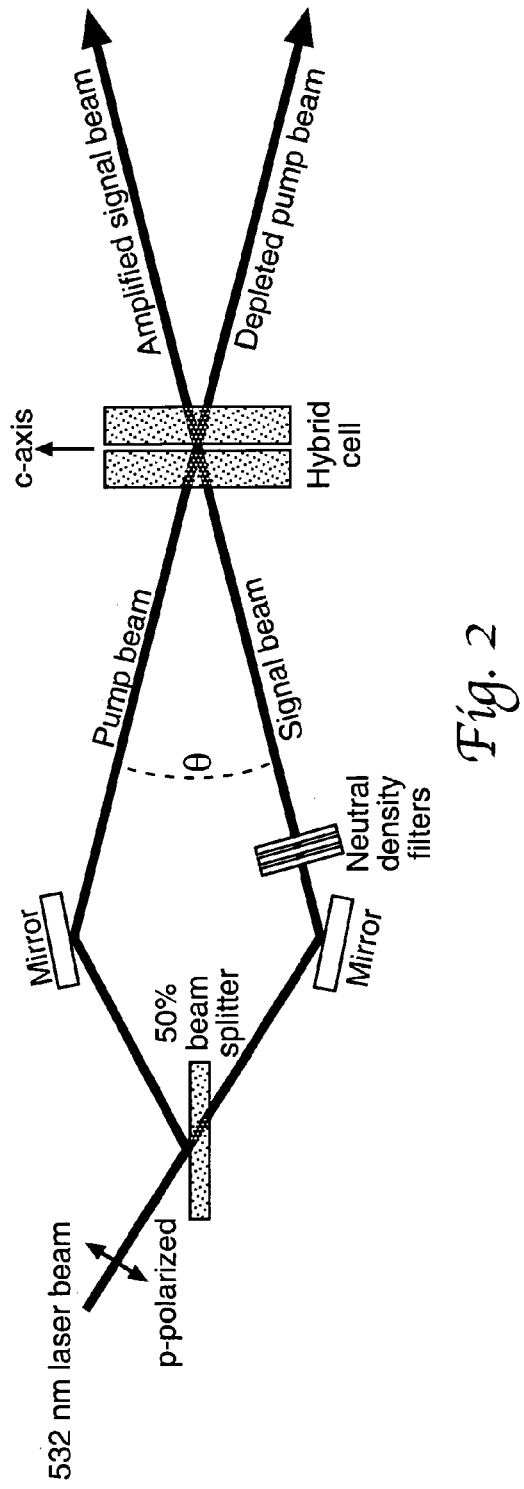
FIG. 2 shows a hybrid cell positioned within an experimental arrangement.

FIG. 2 shows the nanoparticle-doped hybrid cell used in an experiment. A 532 nm continuous wave laser together with a 50% reflective beam splitter provided the pump and signal beams. Two 100% reflective mirrors controlled the beam intersection angle, $\theta$, creating an interference pattern in the hybrid cell with fringe spacing, $\Lambda$, given by $\Lambda=\lambda/2\sin(\theta/2)$, where $\lambda$ is the laser wavelength in air. The pump beam power at the hybrid cell was 10 mW with a 4 mm $1/e^2$ diameter spot size, giving a local peak pump intensity of approximately 160 mW $cm^{-2}$. Neutral density filters attenuated the signal power to 7 µW, giving a local peak signal intensity of approximately 56 µW $cm^{-2}$ with a spot size identical to the pump beam. The low signal intensity ensured that the net gain for the hybrid cell remained in the small signal regime during the experiment.

The hybrid cell was placed at the overlap of the pump and signal beams and oriented approximately normal to the bisector of the two beams with the c-axis of each window in the plane of the incident polarization. The c-axes directions were such that the signal beam was amplified by the Ce:SBN. Prior to filling with liquid crystal, the gain of the cell filled with oil of a similar refractive index to the liquid crystal was measured at each grating spacing to provide reference gain characteristics of the Ce:SBN windows. After cleaning and re-coating the cell windows, the cell was filled with either pure or nanoparticle doped liquid crystal and the gain measurements repeated. For each grating spacing, the gain of the liquid crystal was determined by dividing the liquid crystal filled cell gain by the oil filled cell gain. The gain coefficient, $\Gamma$, for the liquid crystal is then given by $\Gamma=d^{-1}\log_e(G)$, where G is the small signal gain and d is thickness of the liquid crystal layer. Care was taken to ensure the assembled cells were free of any scatter or liquid crystal defects prior to making two-beam coupling measurements.

The physical morphology of the prepared nanoparticle suspensions in heptane and oleic acid varied considerably with grinding time. For grinding periods varying from a few hours to 24 hours, the resulting suspensions progressively and gradually changed from rapid sedimentation to very slow sedimentation to no sedimentation with a gel-like consistency. Transmission electron microscopy (TEM) imaging showed the average nanoparticle size reduced asymptotically as the grinding time increased, reaching a minimum average diameter of approximately 9 nm. Table 1 correlates the grinding times with the particles sizes and the corresponding morphology of the 4.5 weight % nanoparticle stock solutions.

Table 1. $BaTiO^3$ mixture particle sizes and solution morphologies as a function of grinding time.

| Grinding Time | Average particle diameter | Stock solution morphology |
|---|---|---|
| 3 hours | 26 nm | Firm sediment |
| 7 hours | 14.9 nm | Soft sediment |
| 10 hours | 11.6 nm | No sediment, solution remains liquid |
| 16 hours | 9.5 nm | No sediment, increased viscosity |
| 20 hours | 9.2 nm | No sediment, gel-like consistency |
| 24 hours | 9.0 nm | No sediment, self-supporting gel |

Figure 3:
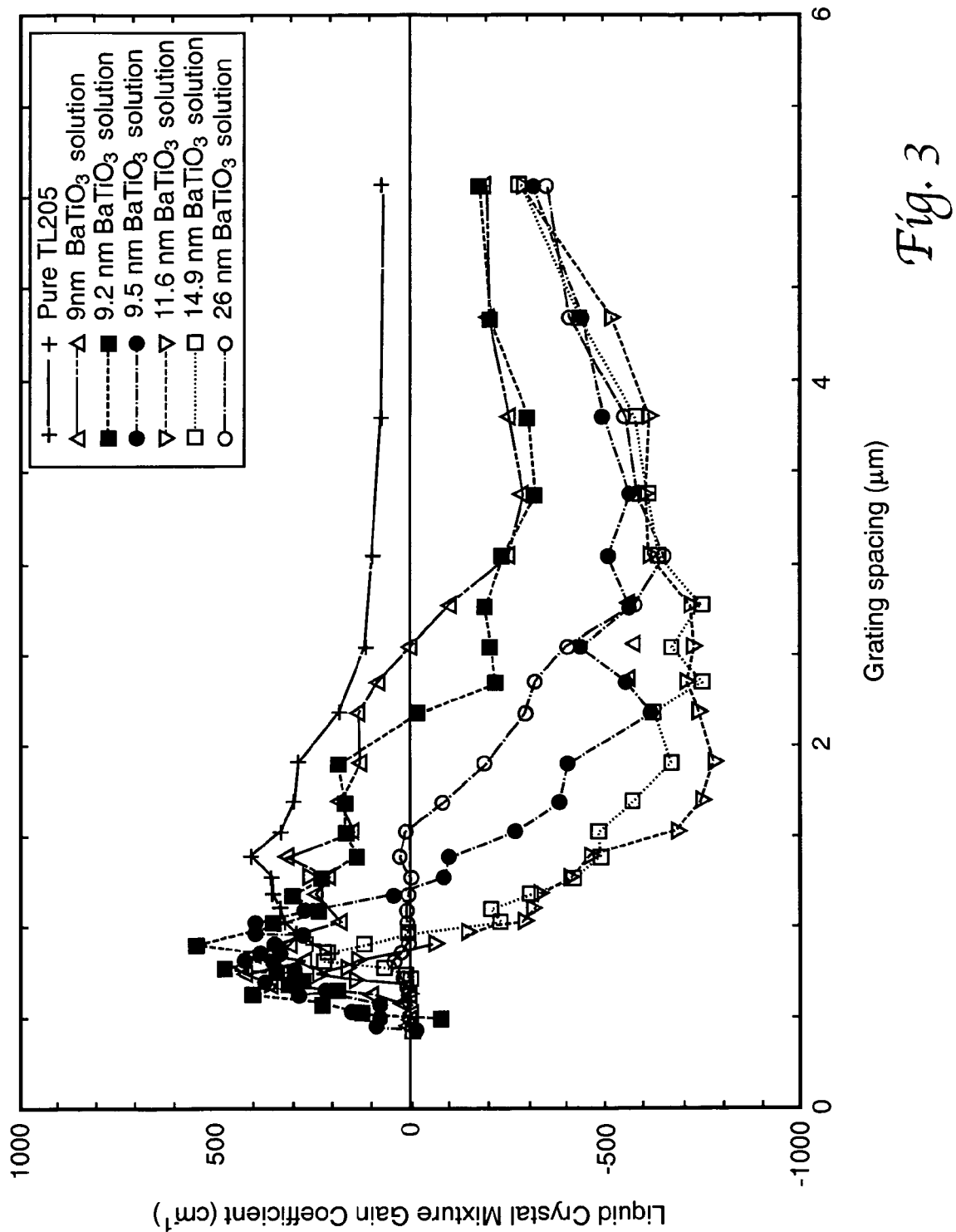
FIG. 3 is a graph showing gain coefficient versus grating spacing for a fixed nanoparticle concentration and a variety of nanoparticle sizes.

Based on the preceding exemplary embodiment, a comparative study was made to observe the photorefractive effects with different particle sizes used to make up the 0.5 weight % $BaTiO_3$/TL205 liquid crystal solutions. FIG. 3 compares the small signal gain measurements for six different source suspensions of $BaTiO_3$/TL205 with the gain obtained by using pure TL205 (no nanoparticles). The data shows that the added nanoparticles dramatically influence the optical gain characteristics, increasing the magnitude of the gain and reversing the sign of the beam coupling. These effects become progressively more pronounced as the nanoparticle size is initially reduced, creating a maximum effect for particles of 11.6 nm (average) in diameter. Further reductions in particle size then gradually reduce the gain.

Figure 4:
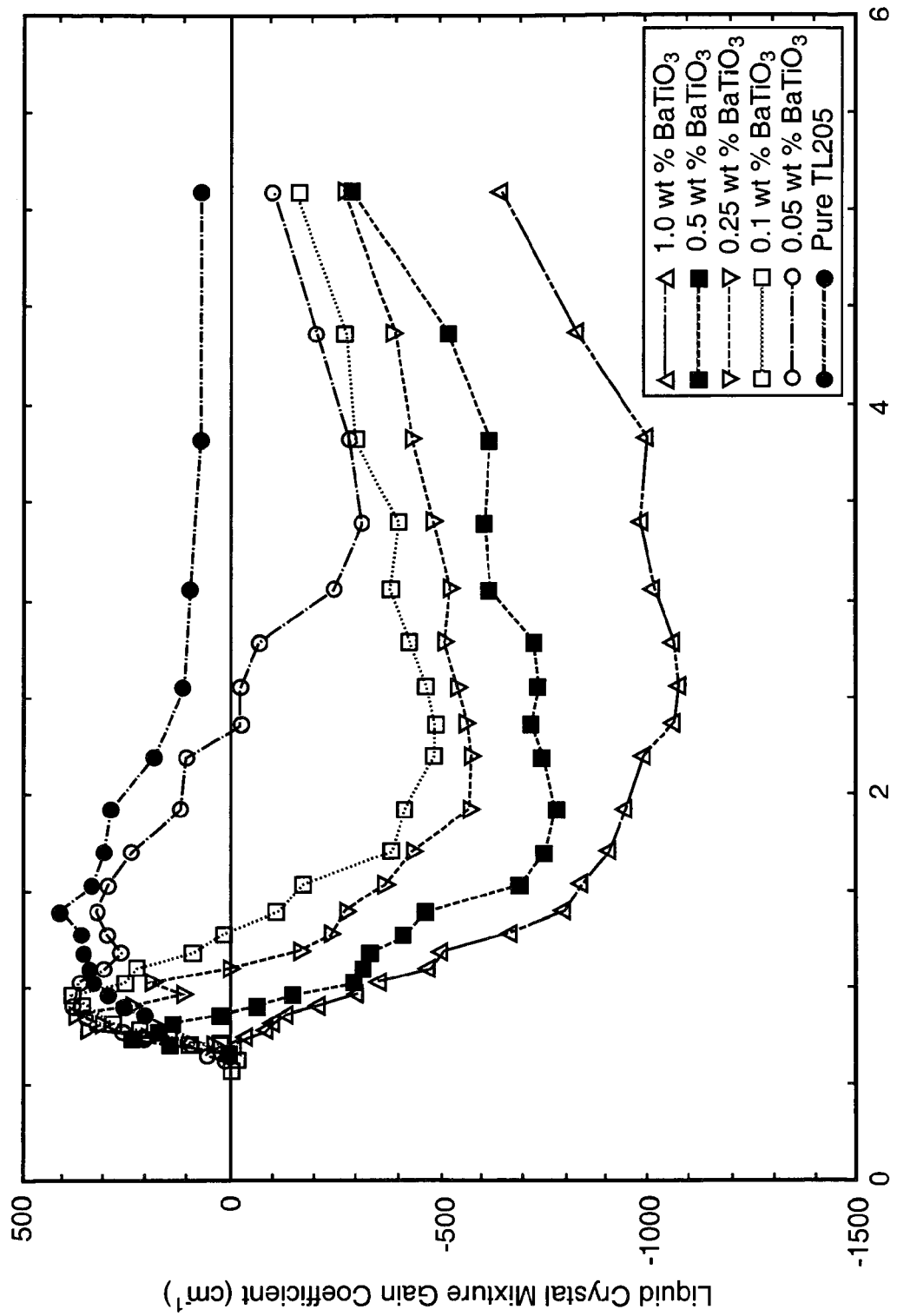
FIG. 4 is a graph showing gain coefficient versus grating spacing for a variety of nanoparticle concentrations and a fixed nanoparticle size.

The experiment was repeated using different concentrations of the optimum 11.6 nm $BaTiO_3$ nanoparticles. FIG. 4 shows how the gain is influenced by nanoparticle concentrations varying between 0.05 weight % to 1 weight %. The trend clearly shows that the gain increases progressively with increased nanoparticle concentration. The maximum gain coefficient was approximately 1100 $cm^{-1}$, an extremely large value for Bragg matched two-beam coupling. No Raman-Nath diffraction was observed during these measurements.

Figure 5:
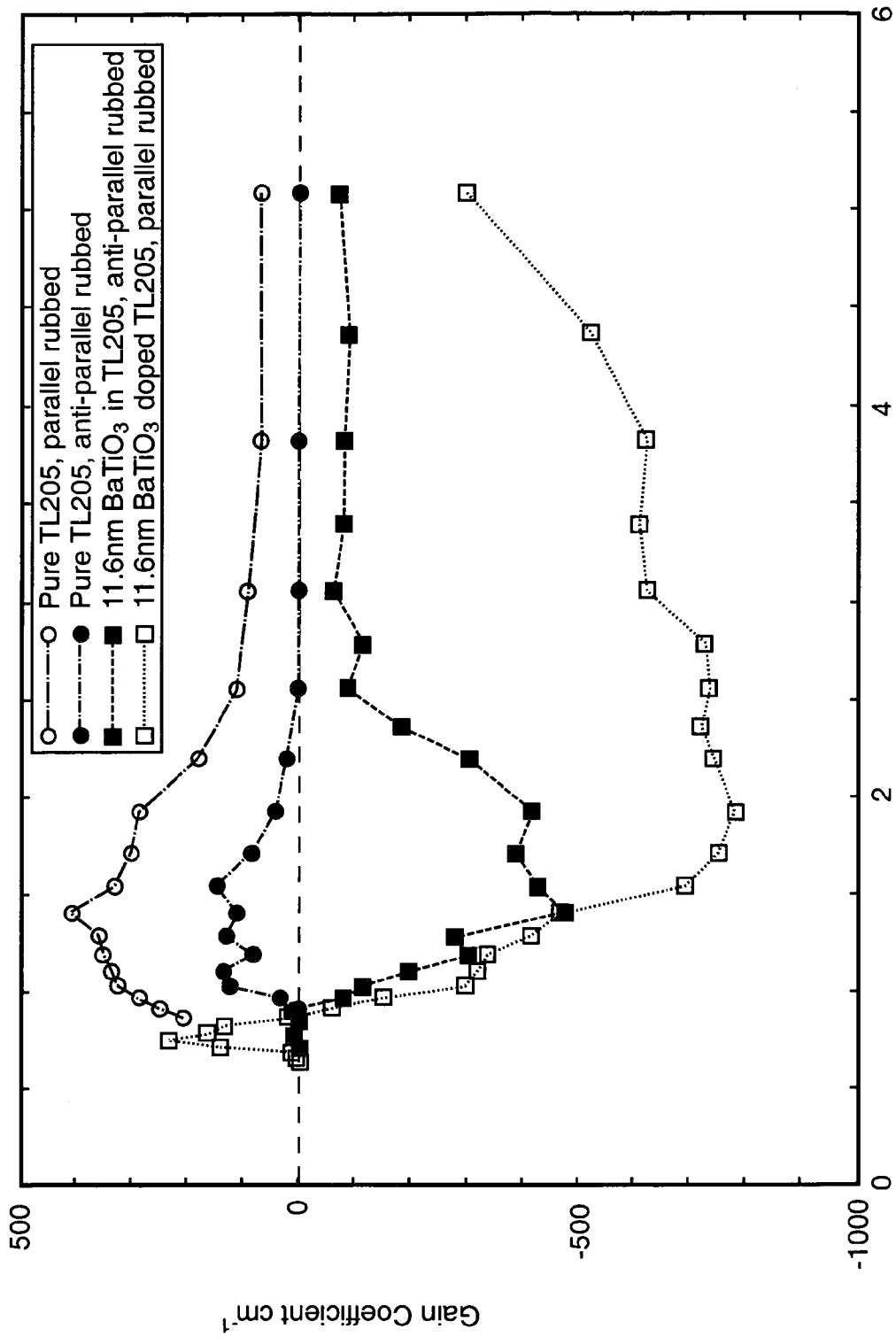
FIG. 5 is a graph showing gain coefficient versus grating spacing for parallel and anti-parallel cell rubbing orientations.

It should be noted that the points of zero gain coefficient in FIGS. 3 and 4 correspond to grating spacings where the positive gain contributions from the TL205 liquid crystal exactly balance the negative gain contributions from the added nanoparticles. It is therefore possible to consider the gain contributions from the nanoparticles and the liquid crystals as being independent quantities. To test this possibility, the gain for cells with and without nanoparticles was measured using parallel rubbed and anti-parallel rubbed Ce:SBN cells. Anti-parallel rubbing minimizes the liquid crystal alignment splay and corresponding gain. However, FIG. 5 shows that the difference between the nanoparticle doped and undoped maximum gain coefficients is not constant for the two rubbing conditions. The gain contribution from the nanoparticles is therefore directly linked to the gain contributions arising from the pure liquid crystal. The nanoparticle and liquid crystal gains therefore cannot be separated as independent variables.

In preceding embodiments, the hybrid cell was made from two windows of Ce:SBN and TL205 liquid crystal, doped with nanoparticles of $BaTiO_3$. The liquid crystal two beam coupling gain was found to reverse in sign and increase in magnitude through the addition of ferroelectric $BaTiO_3$ nanoparticles, yielding gain coefficients up to 1100 $cm^{-1}$ in the Bragg regime in comparison to the undoped case where the gain coefficient was 450 $cm^{-1}$. The novel effects of gain reversal and magnitude increase is attributed to interactions between the ferroelectric particles' spontaneous polarization and the local liquid crystal flexopolarization.

In another embodiment of the present invention, a hybrid cell is made from two windows of Ce:SBN and E7 liquid crystal, doped with nanoparticles of SPS (tin hypothiodiphosphate). In this configuration, the nanoparticle influence on the cell gain peaked at 600 $cm^{-1}$ gain coefficient. Using the manufacturing processes and experiments disclosed herein, one with ordinary skill in the art could determine the nanoparticle influence on the cell gain of various doped hybrid cell configurations (i.e., cell configurations including windows of SBN; gain media of liquid crystal or polymer material; and nanoparticles).

It is further contemplated that the nanoparticle-doped hybrid cells of the present invention may be used in conjunction with holographic and non-holographic devices. Holographic devices include beam coupling, phase controllers, displays, phase conjugators, spatial light modulators, and diffractive optical elements. Non-holographic devices include optical light valves and optical displays.

While various descriptions of the present invention are described above, it should be understood that the various features can be used singly or in any combination thereof. Therefore, this invention is not to be limited to only the specifically preferred embodiments depicted herein. Further, it should be understood that variations and modifications within the spirit and scope of the invention may occur to those skilled in the art to which the invention pertains. Accordingly, all expedient modifications readily attainable by one versed in the art from the disclosure set forth herein that are within the scope and spirit of the present invention are to be included as further embodiments of the present invention. The scope of the present invention is accordingly defined as set forth in the appended claims.

What is claimed is:

1. A photorefractive hybrid cell comprising:
   a window; and
   a gain media disposed adjacent the window, the gain media having nanoparticles disposed therein,
   wherein the nanoparticles are one of ferroelectric and ferromagnetic.

2. The hybrid cell of claim 1, wherein the window includes a material that forms a space-charge field.

3. The hybrid cell of claim 2, wherein the window includes photorefractive material.

4. They hybrid cell of claim 1, wherein the gain media includes material having refractive index properties that depend on an electric field, molecular orientation, or combinations thereof.

5. The hybrid cell of claim 4, wherein the gain media includes electro-optic material.

6. The hybrid cell of claim 4, wherein the gain media includes birefringent material.

7. The hybrid cell of claim 6, wherein the gain media include material selected form the group consisting of liquid crystal and polymer materials.

8. The hybrid cell of claim 1, wherein the nanoparticles include a material which responds orientationally to the presence of an electric or a magnetic field.

9. The hybrid cell of claim 8, wherein the material dynamically reorients in the presence of an electric or magnetic field.

10. The hybrid cell of claim 8, wherein the nanoparticles are selected from a group consisting of barium titanate (BaTiO$_3$), lead titanate (PbTiO$_3$), lithium niobate (LiNbO$_3$), potassium niobate (KNbO$_3$), and combinations thereof.

11. The hybrid cell of claim 8, wherein the nanoparticles each have a size in the range of approximately 0.1 nm to approximately 500 nm.

12. The hybrid cell of claim 8, wherein a concentration of nanoparticles in the gain media is in the range of approximately 0.001 wt % to approximately 10.0 wt %.

13. The hybrid cell of claim 8, wherein the nanoparticles include a coating.

14. A photorefractive hybrid cell comprising:
    a first window;
    a second window; and
    a gain media disposed between the first and second windows,
    wherein the gain media is doped with nanoparticles, and
    wherein the nanoparticles are one of ferroelectric and ferromagnetic.

15. The hybrid cell of claim 14, wherein at least one of the first and second windows includes a material that forms a space-charge field.

16. The hybrid cell of claim 15, wherein at least one of the first and second windows includes photorefractive material.

17. They hybrid cell of claim 14, wherein the gain media includes material having refractive index properties that depend on an electric field, molecular orientation, or combinations thereof.

18. The hybrid cell of claim 17, wherein the gain media includes material selected from a group consisting of electro-optic material and birefringent material.

19. The hybrid cell of claim 18 wherein the gain media include material selected form the group consisting of liquid crystal and polymer materials.

20. The hybrid cell of claim 14, wherein the nanoparticles include a material which dynamically reorients in the presence of an electric or magnetic field.

* * * * *